US007020836B2

(12) United States Patent
Beverly

(10) Patent No.: US 7,020,836 B2
(45) Date of Patent: Mar. 28, 2006

(54) ONE'S COMPLEMENT PIPELINED CHECKSUM

(75) Inventor: Harlan T. Beverly, McDade, TX (US)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 10/208,892

(22) Filed: Jul. 30, 2002

(65) Prior Publication Data

US 2004/0025108 A1    Feb. 5, 2004

(51) Int. Cl.
 *G06F 11/00*    (2006.01)
(52) U.S. Cl. ....................... 714/808; 714/801
(58) Field of Classification Search ................ 709/236; 370/252; 714/801, 752, 808; 710/52, 105
See application file for complete search history.

(56) References Cited

U.S. PATENT DOCUMENTS 5,430,842 A * 7/1995 Thompson et al. ......... 709/236
5,663,952 A * 9/1997 Gentry, Jr. .................. 370/252
5,826,032 A * 10/1998 Finn et al. .................. 709/236
6,643,821 B1 * 11/2003 Karim et al. ............... 714/801
6,654,823 B1 * 11/2003 Soejima et al. ............... 710/52
6,704,899 B1 * 3/2004 Dold et al. ................. 714/752
6,785,753 B1 * 8/2004 Weber et al. ............... 710/105

* cited by examiner

*Primary Examiner*—David Ton
(74) *Attorney, Agent, or Firm*—Schwegman, Lundberg, Woessner & Kluth, P.A.

(57) ABSTRACT

Received data is provided to a pipelined network in which a one's complement checksum is computed. The computed checksum is stored in a register. In further embodiments, at least one intermediate result in the pipelined network is stored in at least one corresponding register. Other embodiments include determining whether the digital data to be included in the checksum is odd or even based on a number of valid bytes, and selectively swapping bytes in the pipelined checksum network based on whether the digital data is determined to be odd or even. In some embodiments, the received digital data is masked to selectively choose received digital data to be included in the checksum.

44 Claims, 3 Drawing Sheets

ONE'S COMPLEMENT PIPELINED CHECKSUM

FIELD OF THE INVENTION

The invention relates generally to electronic data, and more specifically to computing a one's complement checksum in a pipelined network.

BACKGROUND OF THE INVENTION

When digital signals are transmitted across electrical connections, integrity of the digital signal typically is verified to ensure that information was not lost in transmission. Various methods exist for performing verification on digitally transmitted data, including use of parity bits, checksums, and special data coding methods.

One such data verification method is the one's complement checksum widely used in network communication via the Internet Protocol (IP), and which forms a part of the IP protocol layer definition for IP header packets (see Request for Comments RFC 1071, Network Working Group). The idea behind the IP checksum centers around addition of the transmitted words, and transmitting an indication of the sum or checksum. Upon receipt of the data, the receiver performs the same calculation on the received data and compares the result with an expected result.

In the specific application of IP headers, the one's complement sum of checksummed bytes is itself the checksum. Upon receipt of the IP header, the sum of checksummed bytes is again calculated, and the resulting sum is added to the received checksum. Because the received checksum and the computed sum of received bytes should be one's complements of each other, adding the received checksum and the computed sum together should result in a byte that is all 1's. Therefore, if all data received, including the one's complement checksum, is added, the result should be all 1's, or FFFF in the case of IP header checksum computation. One's complement checksums are similarly utilized in Terminal Control Program (TCP), User Datagram Protocol (UDP), and many other protocols and systems.

Unfortunately, calculation of a checksum for both transmitted and received data typically requires that a number of mathematical functions be performed in a processor, delaying packet coding or verification until the checksum is computed. Further, processing capability to calculate the checksum must be built into the appropriate communications device, often requiring significant power and integrated circuit die space.

A one's complement checksum calculation that is efficient to implement and operate is therefore desirable.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides a one's complement checksum calculation system that is efficient to implement and operate. It includes in various embodiments both methods and various apparatus incorporating a pipelined network in which a one's complement checksum is computed. In further embodiments, intermediate results are calculated in the pipelined network, and the intermediate results are stored in registers. Other embodiments include determining whether the digital data to be included in the checksum is odd or even based on a number of valid bytes, and selectively swapping bytes in the pipelined checksum network based on whether the digital data is determined to be odd or even. In some embodiments, the received digital data is masked to selectively choose received digital data to be included in the checksum.

Figure 1:
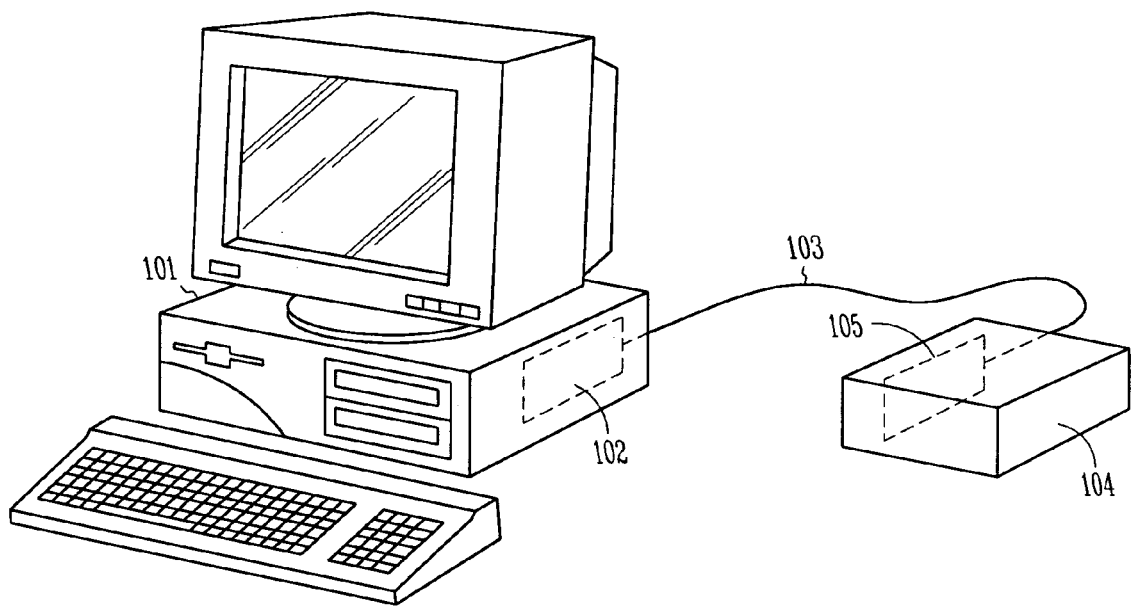
FIG. 1 illustrates a computerized network system as may be used to practice various embodiments of the present invention.

FIG. 1 illustrates a computerized system such as may be used to practice the present invention. A computer 101 is shown, and includes a network interface card 102. The network interface card is here connected via a network cable 103 to a router 104. The router 104 has various network interface adapters 105, providing connectivity between various attached networked devices.

The components of FIG. 1 are in some embodiments of the invention part of an IP protocol network, and the network interface card 102 and network interface adapter 105 contain elements including the pipelined one's complement network of the present invention. The invention is not so limited, however, and is easily adaptable to TCP, UDP, and a variety of other protocols and systems. The example network interface components illustrated in FIG. 1 are operable to compute a one's complement checksum for digital network data via use of the pipelined one's complement network and various other components as described in greater detail herein.

Figure 2:
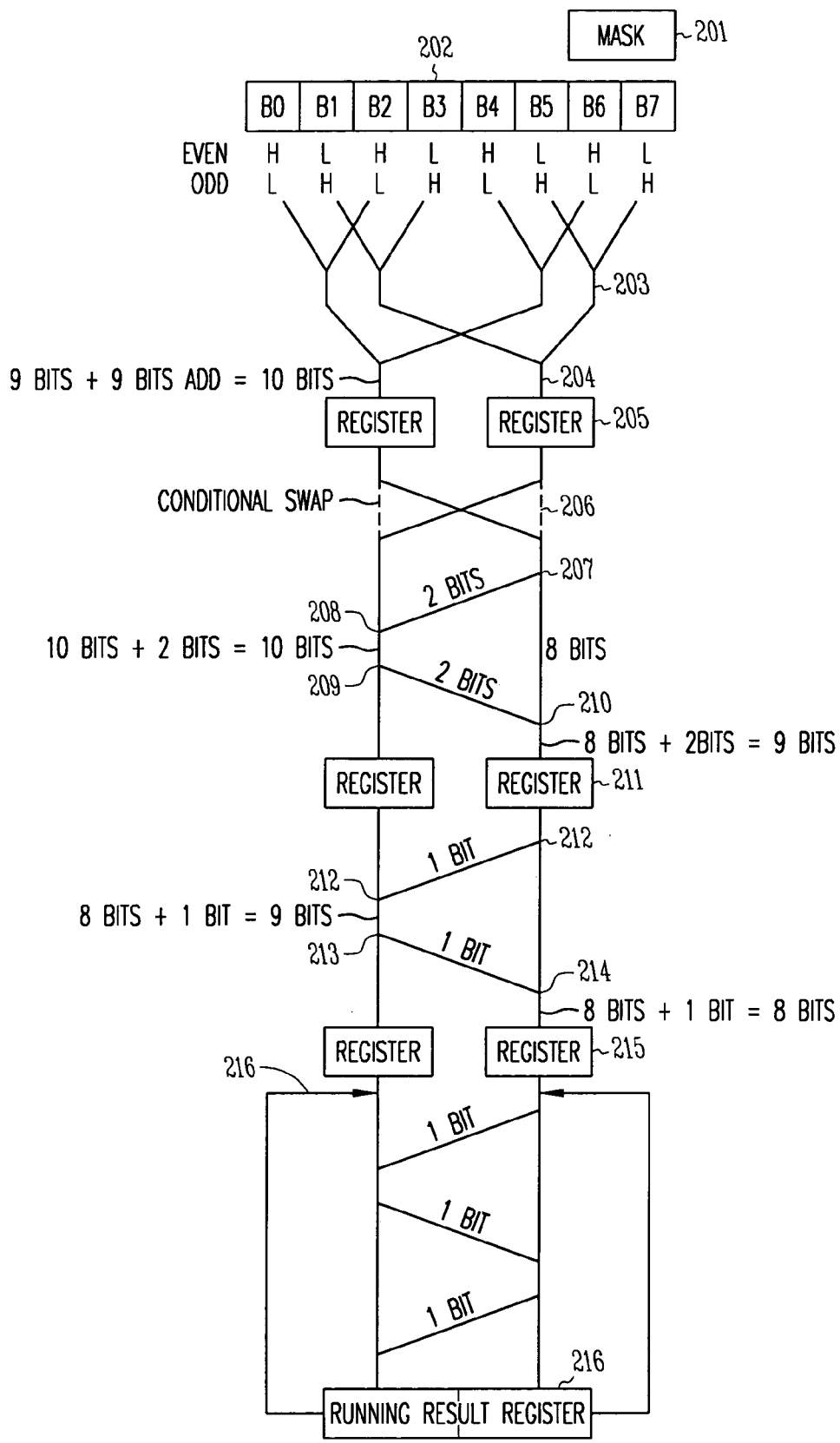
FIG. 2 illustrates a one's complement checksum pipelined network, consistent with an embodiment of the present invention.

FIG. 2 illustrates an example pipelined one's complement checksum network, consistent with an embodiment of the present invention. The specific embodiment discussed here may be applied to a 10 Gigabit ethernet controller, which will require receipt of eight bytes per clock cycle in the checksum network. Incoming digital data is parsed such that the header portion of an IP packet is routed via the mask to the incoming data registers B0–B7, shown at 202. The high byte and low byte positions of a 16-bit word are used to determine whether the data latched in registers 202 are odd or even, as illustrated below the register positions at 202.

On a clock signal transition, not all bytes in the registers B0–B7 may be valid, and so mask bits are added to the bytes not having valid data. Pairs of bytes are added at 203, such that adding a pair of two's complement 8-bit bytes results in a 9-bit result. Each 9-bit result is then fed further down the network, and the four 9-bit results are then added in pairs at 204 to form a 10-bit result. This 10-bit result is stored in the registers shown at 205, which latch the received result on each clock cycle. One of the registers 205 contains the added high bytes as indicated at 202, and the other register 205 contains the sum of the low bytes as indicated at 202.

These 10-bit words stored in the registers at 205 are then selectively swapped as shown at 206. The bytes may or may not be swapped, depending on determination of whether the quadword stored in registers B0–B7 is determined to be even or odd. In this example, the words are swapped if the quadword is odd, and are not swapped if the quadword is even.

At 207, the two most significant bits of the right-side pipeline are split off in a one's complement carry operation and are added to the left side pipe sum at 208. At 209, the two most significant bits of the resulting 10-bit word are split off and are added to the right side pipe sum at 210. The resulting sums of the left and rights pipes are then stored in registers at 211, which latch the data received from the pipeline on each clock cycle. The most significant bit of the right pipeline is again split off at 212, resulting in an 8-bit word in the right side pipeline. This bit is added to the left side pipeline at 212. At 213, the most significant bit of the left side pipeline is split off and added to the right side pipeline at 214, resulting in 8-bit words in both the left and right pipelines.

At 215, the 8-bit words are stored in registers, which again latch the data received from the respective pipelines on a clock signal transition. A running result register 216 keeps track of the running sum for computation of the checksum, which is initially zero, and the running result value is added in to the 8-bit words in each pipeline at 216. The result register stores two bytes, one for each side of the pipeline of FIG. 2, and only the byte associated with a specific side of the pipeline is added into the respective side of the pipeline at 216. Because addition of the two 8-bit words at 216 results in 9-bit sum words in each side of the pipeline, bit swapping is again used.

At 217, the most significant bit of the right side of the pipeline is split off and is added to the left side pipeline at 218, resulting in an 8-bit word on the right side of the pipeline and a 9-bit word on the left side of the pipeline. At 219, the most significant bit of the left side of the pipeline is split off and is added to the right side pipeline at 220, resulting in an 8-bit word in the left pipeline and a 9-bit word in the right side of the pipeline. Subsequent splitting of the most significant bit of the right side of the pipeline at 221 and addition of the bit to the left side pipeline at 222 results in an 8 bit sum at 222, which mathematically cannot be a 9-bit result because of the previous bit-carry operations. The resulting 8-bit words in the left side and right side of the pipeline are then stored in the running result register at 216, which upon receipt and processing of all received data for a particular IP packet header holds the one's complement checksum.

Because the example pipelined network illustrated in FIG. 2 involves four register stages subsequent to latching the received digital data at 202, the one's complement checksum result may be read from the running result register 216 after four clock cycles have passed from the time the last of the received data is latched at 202 and propagated into the pipelined network. Positioning registers within the pipeline of FIG. 2 therefore may vary depending on the speed at which the pipeline's combinational logic operates and the speed at which the system clock runs. Faster combinational logic elements and slower system clock speeds may result in fewer registers needed, while faster clock speeds will require a greater number of registers in the pipeline. Placement of registers can be determined based on the distance through the pipeline from the previous register that a signal propagates reliably before the next clock cycle. In other embodiments of the invention, no intermediate registers are used in the pipeline, and the result from the running result register may be read only after sufficient time has passed for the data transferred from the registers at 202 to propagate through the pipeline and be latched in the running result register 216.

Determination of an even or odd quadword and subsequent byte swapping is a result of the pipeline operating on 8-bit words to calculate a one's complement checksum for 16-bit words. Because every 16-bit word must be added together, the high bytes and low bytes of the 16-bit word are identified and added to form a high byte sum and a low byte sum, with carries as necessary.

As an example, consider a case where the first received quadword consists of only three bytes, stored in register locations B5, B6, and B7 of register 202. An odd number of bytes were received, and the quadword is determined to be odd as shown in FIG. 2 because locations B5 and B7 hold high bytes and B6 holds a low byte. Because it is desired to have the high bytes and the low bytes summed in separate halves of the pipelined network in such a way the running result register 216 holds the high byte and low byte of the checksum in a specific order, the high bytes and low bytes are swapped at 206 only if the received quadword is determined to be odd. This ensures that the left half of the pipelined network always contains the high byte, and the right half of the pipelined network contains the low byte. The running result register therefore will contain the high-byte:lowbyte of the one's complement checksum upon receiving the final data from the pipelined network. After the one's complement checksum is read from the running result register, the register is reset to zero so that the one's complement checksum is not added to subsequent checksum sum calculations.

In some embodiments of the invention, pipelined networks such as the pipelined network of FIG. 2 are used in a modular fashion to operate on a wider bus or on more data at a time than the single quadword capacity of register 202. As an example, one embodiment of the invention has two quadword registers 202 in series such that eight words or sixteen bytes are latched at one time, and even or oddness of the received quadword is shared between the separate pipeline networks connected to each of the two quadword registers. Upon completion of calculation, the sums stored in the running result registers 216 of the two pipelined networks are added, yielding the 16 bit one's complement checksum for all the received data. The pipelined network of FIG. 2 can be similarly scaled to receive and process any number of quadwords at once simply by adding additional pipelined network modules and summing the results from each module.

Figure 3:
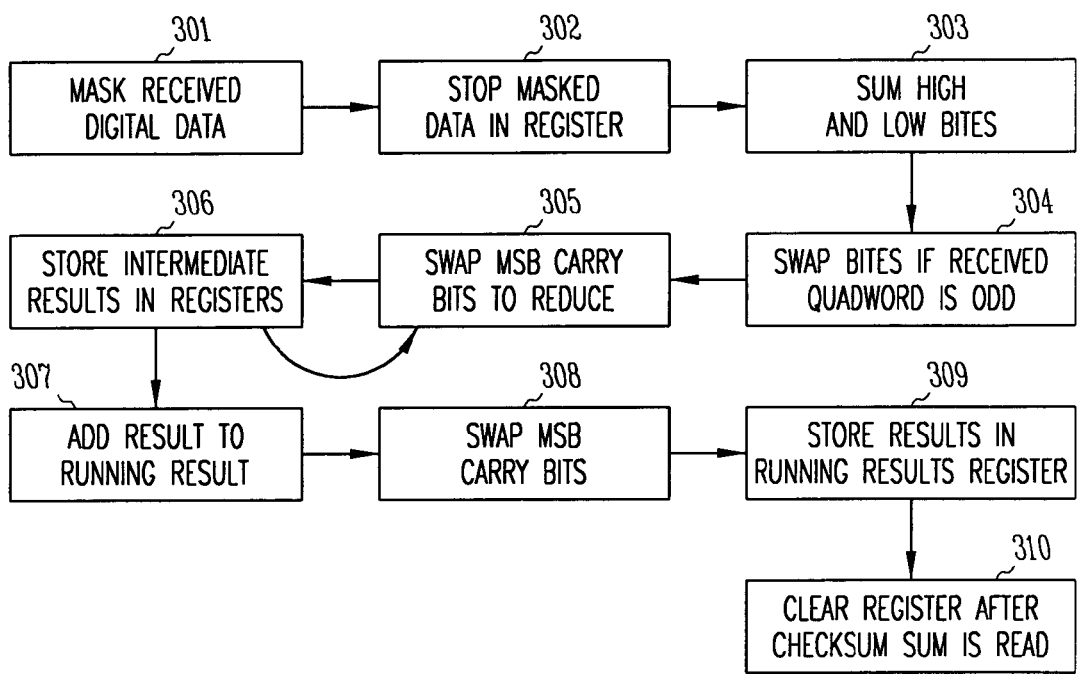
FIG. 3 illustrates a method for computing a one's complement checksum with a pipelined network, consistent with an embodiment of the present invention.

FIG. 3 is a flowchart, illustrating a method of calculating a one's complement checksum consistent with an embodiment of the present invention. At 301, received digital data is masked, so that only that data that is to be included in the checksum is forwarded. As an example, only the header of an IP packet may be masked for inclusion in a checksum, as the remainder of an IP packet is verified using other protocols and methods. At 302, the masked received data is stored in a register, such as register 202 of FIG. 2. The high and low bytes are then summed at 303, as is shown at 203 and 204 of FIG. 2, and bytes are swapped at 304 if the received quadword is determined to be odd to ensure that high and low bytes are properly aligned. At 305, the most significant bit or bits of pipelined sums are alternately split off the high and low byte sum sides of the pipelined network and are added to the opposite side. Intermediate results of computations within the pipelined network are stored in registers, such as at 306 and elsewhere within the method of FIG. 3 if desired. The resulting 8-bit high and low byte sums are then added to the running result high and low byte sums at 307, and another series of most significant bit swaps takes place at 308 to convert the resulting 9-bit high and low byte sums to 8-bit bytes for the high and low byte sums. The high and low byte sums are then stored in the running result register at 309, which upon completion of operation will contain the one's complement checksum result. After the checksum sum is read, the running result register is cleared at 310 so that the checksum sum is not added to subsequent checksum calculations.

The one's complement checksum pipelined network of the present invention may be implemented in a number of systems where data integrity is desired, including not only in data communications networks but also including memory controllers, data security systems, data storage devices, and other digital data communications systems. For example, a digital storage device such as a disk drive may utilize a one's complement pipelined checksum network consistent with the present invention to compute a checksum to verify data integrity in communication between the disk drive and a disk drive controller.

Although an example pipelined network for computing a one's complement checksum has been discussed herein, it is only one example of the invention that illustrates how a pipelined network can be used to compute a one's complement checksum. Other embodiments of the invention will utilize pipelined networks, registers, and interfaces to digital data of varying configurations, all of which are within the scope of the present invention.

Specific embodiments have been illustrated and described herein, but it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A method of calculating a one's complement checksum for received digital data, comprising:
   receiving digital data;
   computing a one's complement checksum for the received digital data in a pipelined network; and
   storing the computed checksum in a register.

2. The method of claim 1, further comprising:
   computing at least one intermediate result in the pipelined network; and
   storing each of the at least one intermediate results in at least one corresponding intermediate register.

3. The method of claim 1, further comprising:
   determining whether the digital data to be included in the checksum is odd or even based on a number of valid bytes; and
   selectively swapping bytes in the pipelined checksum network based on whether the digital data is determined to be odd or even.

4. The method of claim 1, further comprising masking the received digital data to selectively choose received digital data to be included in the checksum.

5. The method of claim 1, wherein the received digital data is data to be transmitted along with the computed checksum.

6. The method of claim 1, wherein the received digital data is data received along with a received checksum, and further comprising comparing the computed checksum with the received checksum to validate the received digital data.

7. The method of claim 1, wherein the received digital data is data received from memory.

8. The method of claim 1, wherein the received digital data is data received from a network.

9. The method of claim 8, wherein the digital data comprises an Internet Protocol packet header.

10. The method of claim 1, wherein the received digital data is data received from a data storage device.

11. The method of claim 1, further comprising using the calculated one's complement checksum to verify data security.

12. The method of claim 1, wherein the pipelined network comprises a first path, a second path, and logic operable to perform one's complement carry operations between the first path and the second path by carrying bits between the first and second paths.

13. A pipelined one's complement checksum network, comprising:
   at least one register for receiving digital data;
   a pipelined one's complement network for computing a one's complement checksum for the received digital data; and
   at least one register for storing computed checksum data.

14. The pipelined one's complement checksum network of claim 13, further comprising:
   at least one intermediate register within the pipelined one's complement network for storing at least one corresponding intermediate result.

15. The pipelined one's complement checksum network of claim 13, further comprising:
   a valid byte counter for determining whether the digital data to be included in the checksum has an odd or even number of valid bytes; and
   a pipeline byte swapper in the pipelined checksum network for selectively swapping bytes based on whether the digital data is determined have an odd or even number of valid bytes.

16. The pipelined one's complement checksum network of claim 13, further comprising a data mask for selectively choosing received digital data to be included in the checksum.

17. The pipelined one's complement checksum network of claim 13, further comprising a transmitter module wherein the received digital data is transmitted along with the computed checksum.

18. The pipelined one's complement checksum network of claim 13, further comprising a comparison module for comparing a checksum received along with the received digital data such that the received checksum is compared with the computed checksum to validate the received digital data.

19. The pipelined one's complement checksum network of claim 13, wherein the pipelined one's complement checksum network comprises part of a memory controller.

20. The pipelined one's complement checksum network of claim 13, wherein the pipelined one's complement checksum network comprises part of a network controller.

21. The pipelined one's complement checksum network of claim 20, wherein the network controller comprises a TCP/IP protocol-compatible network controller.

22. The pipelined one's complement checksum network of claim 13, wherein the pipelined one's complement checksum network comprises part of a data storage device controller.

23. The pipelined one's complement checksum network of claim 13, wherein the pipelined one's complement checksum network comprises part of a data security system.

24. The pipelined one's complement checksum network of claim 13, wherein the pipelined network comprises a first path, a second path, and logic operable to perform one's complement carry operations between the first path and the second path by carrying bits between the first and second paths.

25. A machine-readable medium with instructions encoded thereon, the instructions when executed operable to cause a computerized system to:
receive digital data;
compute a one's complement checksum for the received digital data in a pipelined network; and
store the computed checksum.

26. The machine-readable medium of claim 25, the instructions further operable to cause the computerized system to:
compute at least one intermediate result in the pipelined network; and
store each of the at least one intermediate results in at least one corresponding intermediate register.

27. The machine-readable medium of claim 25, the instructions when executed further operable to cause the computerized system to:
determine whether the digital data to be included in the checksum is odd or even based on a number of valid bytes; and
selectively swap bytes in the pipelined checksum network based on whether the digital data is determined to be odd or even.

28. The machine-readable medium of claim 25, the instructions when executed further operable to cause the computerized system to mask the received digital data to selectively choose received digital data to be included in the checksum.

29. The machine-readable medium of claim 25, wherein the received digital data is data to be transmitted along with the computed checksum.

30. The machine-readable medium of claim 25, wherein the received digital data is data received along with a received checksum, and wherein the instructions are further operable to cause the computerized system to compare the computed checksum with the received checksum to validate the received digital data.

31. The machine-readable medium of claim 25, wherein the received digital data is data received from memory.

32. The machine-readable medium of claim 25, wherein the received digital data is data received from a network.

33. The machine-readable medium of claim 32, wherein the digital data comprises an Internet Protocol packet header.

34. The machine-readable medium of claim 25, wherein the received digital data is data received from a data storage device.

35. The machine-readable medium of claim 25, the instructions when executed further operable to cause the computerized system to use the calculated one's complement checksum to verify data security.

36. The machine-readable medium of claim 25, wherein the instructions are microcode instructions for execution on a processor.

37. The machine-readable medium of claim 25, wherein the pipelined network comprises a first data path, a second data path, and logic operable to perform one's complement carry operations between the first data path and the second data path by carrying bits between the first and second data paths.

38. A data communications system, comprising:
at least one register for receiving digital data;
a pipelined one's complement network for computing a one's complement checksum for the received digital data; and
at least one register for storing computed checksum data.

39. The data communications system of claim 38, further comprising:
at least one intermediate register within the pipelined one's complement network for storing at least one corresponding intermediate result.

40. The data communications system of claim 38, further comprising:
a valid byte counter for determining whether the digital data to be included in the checksum has an odd or even number of valid bytes; and
a pipeline byte swapper in the pipelined checksum network for selectively swapping bytes based on whether the digital data is determined have an odd or even number of valid bytes.

41. The data communications system of claim 38, further comprising a data mask for selectively choosing received digital data to be included in the checksum.

42. The data communications system of claim 38, wherein the at least one register for receiving digital data, the pipelined one's complement network, and the at least one register for storing computed checksum data are part of a network interface card.

43. The data communications system of claim 38, wherein the at least one register for receiving digital data, the pipelined one's complement network, and the at least one register for storing computed checksum data are part of a router.

44. The data communications system of claim 38, wherein the pipelined one's complement network comprises a first path, a second path, and logic operable to perform one's complement carry operations between the first path and the second path by carrying bits between the first and second paths.

* * * * *